(12) United States Patent
Zaidi (10) Patent No.: US 7,760,546 B2
(45) Date of Patent: Jul. 20, 2010

(54) INTEGRATED CIRCUIT INCLUDING AN ELECTRODE HAVING AN OUTER PORTION WITH GREATER RESISTIVITY

(75) Inventor: Shoaib Zaidi, Mechanicsville, VA (US)

(73) Assignee: Qimonda North America Corp., Cary, NC (US)

( * ) Notice: Subject to any disclaimer, the term of this patent is extended or adjusted under 35 U.S.C. 154(b) by 182 days.

(21) Appl. No.: 12/038,850

(22) Filed: Feb. 28, 2008

(65) Prior Publication Data

US 2009/0219755 A1    Sep. 3, 2009

(51) Int. Cl.
*G11C 11/00* (2006.01)
(52) U.S. Cl. ........................ 365/163; 365/148
(58) Field of Classification Search ............. 257/4
See application file for complete search history.

(56) References Cited

U.S. PATENT DOCUMENTS

| | | | |
|---|---|---|---|
| 5,508,212 A | 4/1996 | Wang et al. | |
| 6,878,618 B2 * | 4/2005 | Lowrey et al. | 438/625 |
| 7,005,666 B2 | 2/2006 | Dennison | |
| 7,049,623 B2 | 5/2006 | Lowrey | |
| 7,190,607 B2 * | 3/2007 | Cho et al. | 365/148 |
| 7,511,984 B2 * | 3/2009 | Liu | 365/148 |
| 7,663,135 B2 * | 2/2010 | Lung | 257/4 |
| 2005/0281073 A1 * | 12/2005 | Cho et al. | 365/148 |
| 2006/0113573 A1 | 6/2006 | Cheong et al. | |

* cited by examiner

*Primary Examiner*—Tan T. Nguyen
(74) *Attorney, Agent, or Firm*—Dicke, Billig & Czaja, PLLC (57) ABSTRACT

An integrated circuit includes a first electrode including an inner portion and an outer portion laterally surrounding the inner portion. The outer portion has a greater resistivity than the inner portion. The integrated circuit includes a second electrode and resistivity changing material contacting the first electrode and coupled to the second electrode.

23 Claims, 9 Drawing Sheets

INTEGRATED CIRCUIT INCLUDING AN ELECTRODE HAVING AN OUTER PORTION WITH GREATER RESISTIVITY

BACKGROUND

One type of memory is resistive memory. Resistive memory utilizes the resistance value of a memory element to store one or more bits of data. For example, a memory element programmed to have a high resistance value may represent a logic "1" data bit value and a memory element programmed to have a low resistance value may represent a logic "0" data bit value. Typically, the resistance value of the memory element is switched electrically by applying a voltage pulse or a current pulse to the memory element.

One type of resistive memory is phase change memory. Phase change memory uses a phase change material in the resistive memory element. The phase change material exhibits at least two different states. The states of the phase change material may be referred to as the amorphous state and the crystalline state, where the amorphous state involves a more disordered atomic structure and the crystalline state involves a more ordered lattice. The amorphous state usually exhibits higher resistivity than the crystalline state. Also, some phase change materials exhibit multiple crystalline states, e.g. a face-centered cubic (FCC) state and a hexagonal closest packing (HCP) state, which have different resistivities and may be used to store bits of data. In the following description, the amorphous state generally refers to the state having the higher resistivity and the crystalline state generally refers to the state having the lower resistivity.

Phase changes in the phase change materials may be induced reversibly. In this way, the memory may change from the amorphous state to the crystalline state and from the crystalline state to the amorphous state in response to temperature changes. The temperature changes of the phase change material may be achieved by driving current through the phase change material itself or by driving current through a resistive heater adjacent or nearby the phase change material. With both of these methods, controllable heating of the phase change material causes controllable phase change within the phase change material.

A phase change memory including a memory array having a plurality of memory cells that are made of phase change material may be programmed to store data utilizing the memory states of the phase change material. One way to read and write data in such a phase change memory device is to control a current and/or a voltage pulse that is applied to the phase change material or to a resistive material adjacent or nearby the phase change material. The temperature in the phase change material in each memory cell generally corresponds to the applied level of current and/or voltage to achieve the heating.

To achieve higher density phase change memories, a phase change memory cell can store multiple bits of data. Multi-bit storage in a phase change memory cell can be achieved by programming the phase change material to have intermediate resistance values or states, where the multi-bit or multilevel phase change memory cell can be written to more than two states. If the phase change memory cell is programmed to one of three different resistance levels, 1.5 bits of data per cell can be stored. If the phase change memory cell is programmed to one of four different resistance levels, two bits of data per cell can be stored, and so on. To program a phase change memory cell to an intermediate resistance value, the amount of crystalline material coexisting with amorphous material and hence the cell resistance is controlled via a suitable write strategy.

A typical phase change memory cell includes phase change material between two electrodes. The interface area between the phase change material and at least one of the electrodes determines the power used to program the memory cell. As the interface area between the phase change material and the at least one electrode is reduced, the current density through the phase change material is increased. The higher the current density through the phase change material, the lower the power used to program the phase change material.

For these and other reasons, there is a need for the present invention.

SUMMARY

One embodiment provides an integrated circuit. The integrated circuit includes a first electrode including an inner portion and an outer portion laterally surrounding the inner portion. The outer portion has a greater resistivity than the inner portion. The integrated circuit includes a second electrode and resistivity changing material contacting the first electrode and coupled to the second electrode.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

It is to be understood that the features of the various exemplary embodiments described herein may be combined with each other, unless specifically noted otherwise.

Figure 1:
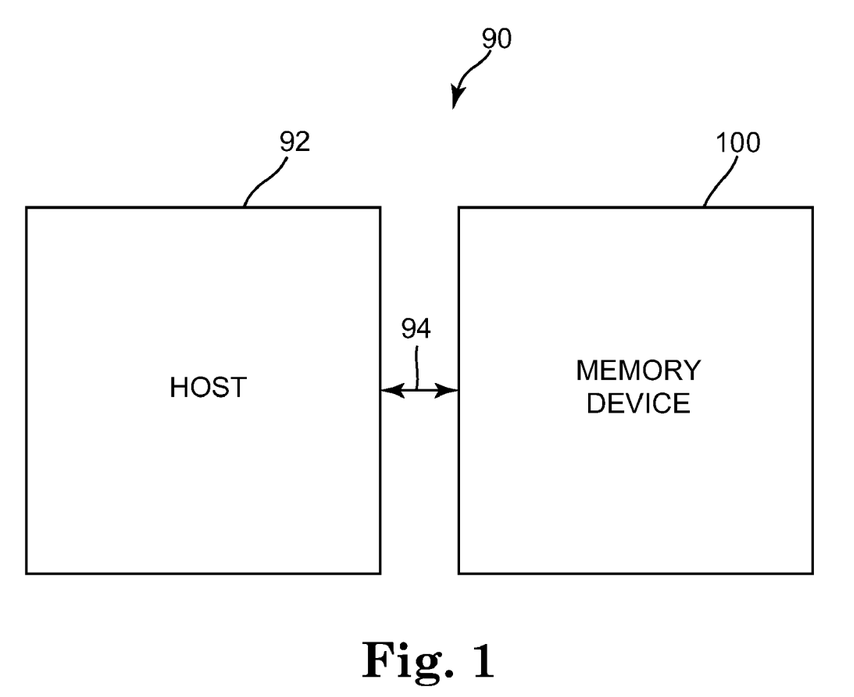
FIG. 1 is a block diagram illustrating one embodiment of a system.

FIG. 1 is a block diagram illustrating one embodiment of a system 90. System 90 includes a host 92 and a memory device 100. Host 92 is communicatively coupled to memory device 100 through communication link 94. Host 92 includes a computer (e.g., desktop, laptop, handheld), portable electronic device (e.g., cellular phone, personal digital assistant (PDA), MP3 player, video player, digital camera), or any other suitable device that uses memory. Memory device 100 provides memory for host 92. In one embodiment, memory device 100 includes a phase change memory device or other suitable resistive or resistivity changing material memory device.

Figure 2:
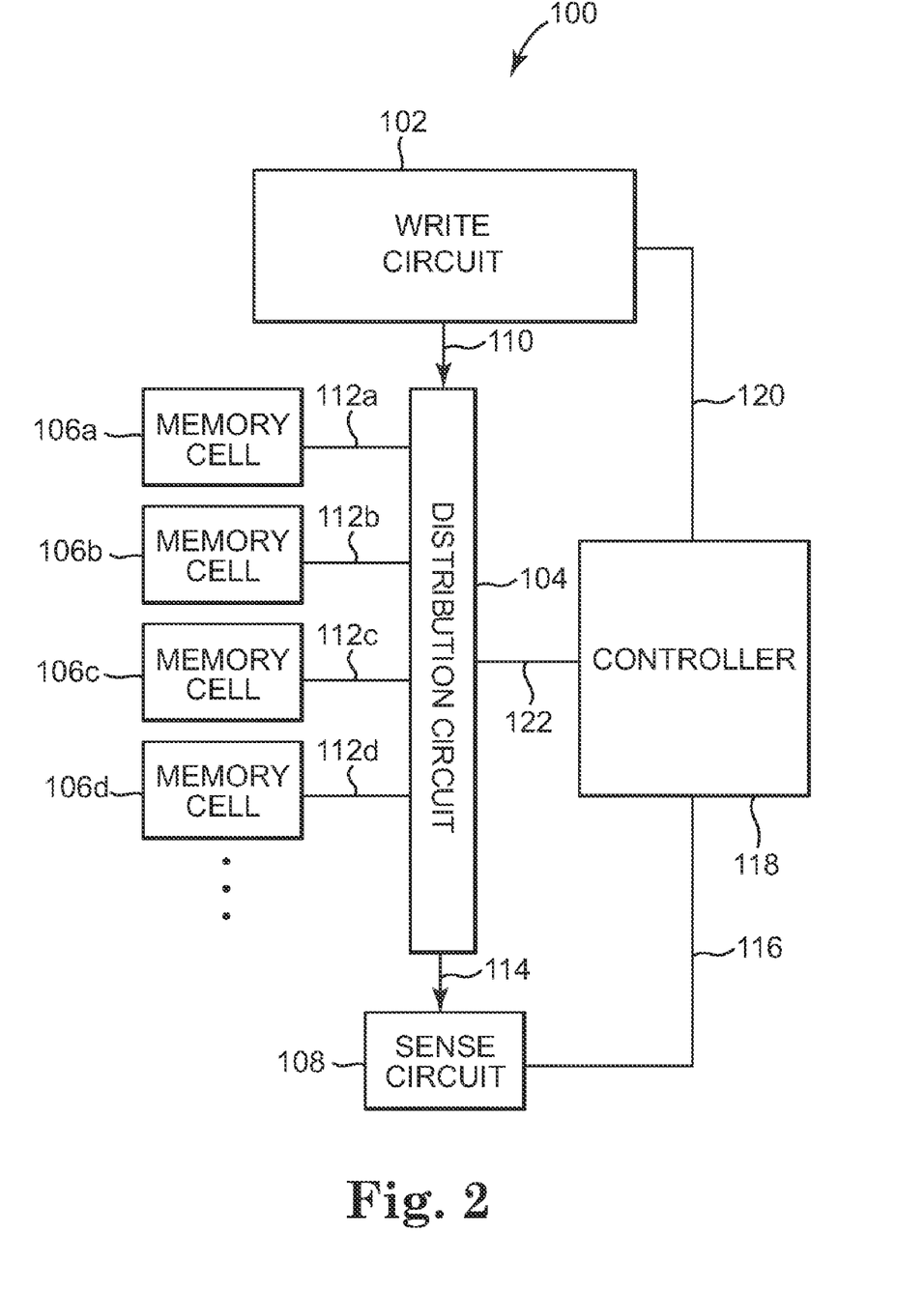
FIG. 2 is a block diagram illustrating one embodiment of a memory device.

FIG. 2 is a block diagram illustrating one embodiment of memory device 100. In one embodiment, memory device 100 is an integrated circuit or part of an integrated circuit. Memory device 100 includes a write circuit 102, a distribution circuit 104, memory cells 106a, 106b, 106c, and 106d, a controller 118, and a sense circuit 108. Each of the memory cells 106a-106d is a phase change memory cell that stores data based on the amorphous and crystalline states of phase change material in the memory cell. Also, each of the memory cells 106a-106d can be programmed into one of two or more states by programming the phase change material to have intermediate resistance values. To program one of the memory cells 106a-106d to an intermediate resistance value, the amount of crystalline material coexisting with amorphous material and hence the cell resistance is controlled using a suitable write strategy.

Each of the memory cells 106a-106d includes an electrode contacting phase change material. The electrode includes an outer or sidewall portion and an inner or core portion. The outer or sidewall portion has a greater resistivity than the inner or core portion. In one embodiment, the greater resistivity of the outer or sidewall portion is obtained by implanting the outer or sidewall portion with a dopant using ion beam implantation, plasma immersion ion implantation, or other suitable implantation technique. By increasing the resistivity of the outer or sidewall portion, the critical dimension (CD) of the interface area between the electrode and the phase change material is effectively reduced to the inner or core portion. By reducing the effective CD of the interface area, the current density through the electrode is increased, thereby reducing the power used to program the phase change material. In addition, the thermal conductivity of the outer or sidewall portion decreases with increased resistivity. By decreasing the thermal conductivity, the thermal insulation of the active area of the phase change material increases. The increase in thermal insulation also reduces the power used to program the phase change material.

As used herein, the term "electrically coupled" is not meant to mean that the elements must be directly coupled together and intervening elements may be provided between the "electrically coupled" elements.

Write circuit 102 is electrically coupled to distribution circuit 104 though signal path 110. Distribution circuit 104 is electrically coupled to each of the memory cells 106a-106d through signal paths 112a-112d. Distribution circuit 104 is electrically coupled to memory cell 106a through signal path 112a. Distribution circuit 104 is electrically coupled to memory cell 106b through signal path 112b. Distribution circuit 104 is electrically coupled to memory cell 106c through signal path 112c. Distribution circuit 104 is electrically coupled to memory cell 106d through signal path 112d. Distribution circuit 104 is electrically coupled to sense circuit 108 through signal path 114. Sense circuit 108 is electrically coupled to controller 118 through signal path 116. Controller 118 is electrically coupled to write circuit 102 through signal path 120 and to distribution circuit 104 through signal path 122.

Each of the memory cells 106a-106d includes a phase change material that may be changed from an amorphous state to a crystalline state or from a crystalline state to an amorphous state under the influence of temperature change. The amount of crystalline phase change material coexisting with amorphous phase change material in one of the memory cells 106a-106d thereby defines two or more states for storing data within memory device 100.

In the amorphous state, a phase change material exhibits significantly higher resistivity than in the crystalline state. Therefore, the two or more states of memory cells 106a-106d differ in their electrical resistivity. In one embodiment, the two or more states include two states and a binary system is used, wherein the two states are assigned bit values of "0" and "1". In another embodiment, the two or more states include three states and a ternary system is used, wherein the three states are assigned bit values of "0", "1", and "2". In another embodiment, the two or more states include four states that are assigned multi-bit values, such as "00", "01", "10", and "11". In other embodiments, the two or more states can be any suitable number of states in the phase change material of a memory cell.

Controller 118 controls the operation of write circuit 102, sense circuit 108, and distribution circuit 104. Controller 118 includes a microprocessor, microcontroller, or other suitable logic circuitry for controlling the operation of write circuit 102, sense circuit 108, and distribution circuit 104. Controller 118 controls write circuit 102 for setting the resistance states of memory cells 106a-106d. Controller 118 controls sense circuit 108 for reading the resistance states of memory cells 106a-106d. Controller 118 controls distribution circuit 104 for selecting memory cells 106a-106d for read or write access. In one embodiment, controller 118 is embedded on the same chip as memory cells 106a-106d. In another embodiment, controller 118 is located on a separate chip from memory cells 106a-106d.

In one embodiment, write circuit 102 provides voltage pulses to distribution circuit 104 through signal path 110, and distribution circuit 104 controllably directs the voltage pulses to memory cells 106a-106d through signal paths 112a-112d. In another embodiment, write circuit 102 provides current pulses to distribution circuit 104 through signal path 110, and distribution circuit 104 controllably directs the current pulses to memory cells 106a-106d through signal paths 112a-112d. In one embodiment, distribution circuit 104 includes a plurality of transistors that controllably direct the voltage pulses or the current pulses to each of the memory cells 106a-106d.

Sense circuit 108 reads each of the two or more states of memory cells 106a-106d through signal path 114. Distribution circuit 104 controllably directs read signals between sense circuit 108 and memory cells 106a-106d through signal paths 112a-112d. In one embodiment, distribution circuit 104 includes a plurality of transistors that controllably direct read signals between sense circuit 108 and memory cells 106a-106d.

In one embodiment, to read the resistance of one of the memory cells 106a-106d, sense circuit 108 provides current that flows through one of the memory cells 106a-106d and sense circuit 108 reads the voltage across that one of the memory cells 106a-106d. In another embodiment, sense circuit 108 provides voltage across one of the memory cells 106a-106d and reads the current that flows through that one of the memory cells 106a-106d. In another embodiment, write circuit 102 provides voltage across one of the memory cells 106a-106d and sense circuit 108 reads the current that flows through that one of the memory cells 106a-106d. In another embodiment, write circuit 102 provides current through one of the memory cells 106a-106d and sense circuit 108 reads the voltage across that one of the memory cells 106a-106d.

To program a memory cell 106a-106d within memory device 100, write circuit 102 generates one or more current or voltage pulses for heating the phase change material in the target memory cell. In one embodiment, write circuit 102 generates appropriate current or voltage pulses, which are fed into distribution circuit 104 and distributed to the appropriate target memory cell 106a-106d. The amplitude and duration of the current or voltage pulses are controlled depending on whether the memory cell is being set or reset. Generally, a "set" operation of a memory cell is heating the phase change material of the target memory cell above its crystallization temperature (but usually below its melting temperature) long enough to achieve the crystalline state or a partially crystalline and partially amorphous state. Generally, a "reset" operation of a memory cell is heating the phase change material of the target memory cell above its melting temperature, and then quickly quench cooling the material, thereby achieving the amorphous state or a partially amorphous and partially crystalline state.

Figure 3:
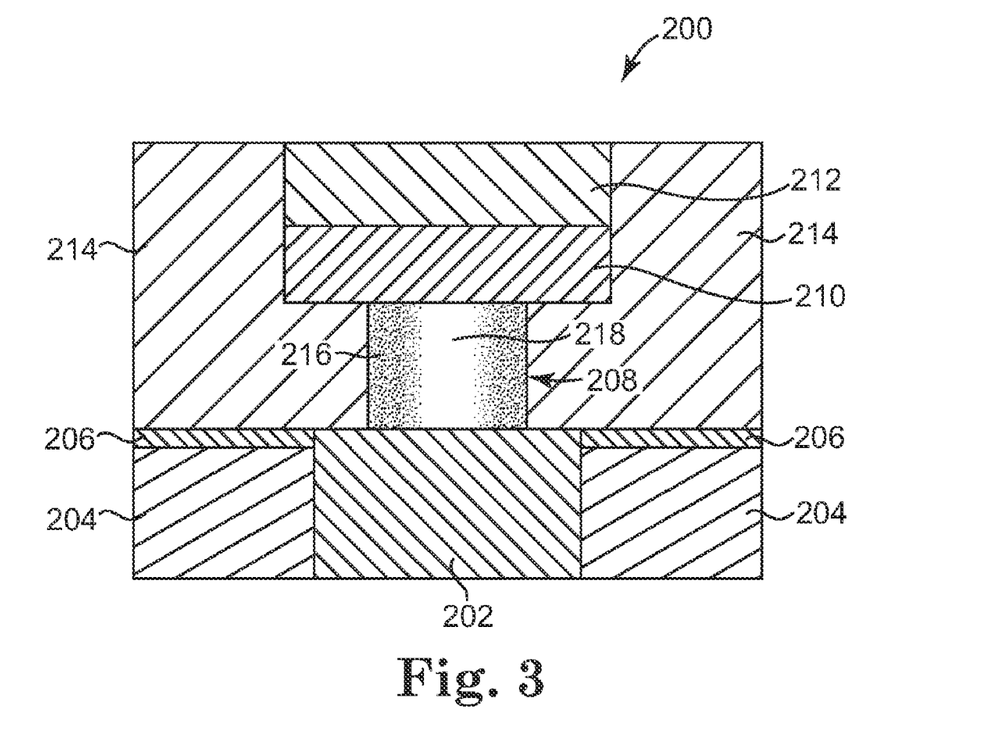
FIG. 3 illustrates a cross-sectional view of one embodiment of a phase change memory cell.

FIG. 3 illustrates a cross-sectional view of one embodiment of a phase change memory cell 200. In one embodiment, each of the phase change memory cells 106a-106d is similar to phase change memory cell 200. Phase change memory cell 200 includes a contact 202, a first electrode 208, phase change material 210, a second electrode 212, and dielectric material 204, 206, and 214. First electrode 208 includes an outer or sidewall portion 216 and an inner or core portion 218. The outer portion 216 has a greater resistivity than inner portion 218.

Contact 202 includes W, Cu, Al, or other suitable contact material. The top of contact 202 contacts the bottom of first electrode 208. In one embodiment, first electrode 208 has a smaller cross-sectional width than contact 202. First electrode 208 includes TiN, TaN, W, Al, Ti, Ta, TiSiN, TaSiN, TiAlN, TaAlN, WN, C, Cu, or other suitable electrode material. Outer portion 216 of contact 208 is implanted with N, Si, Al, C, Ar, or other suitable dopant to increase the resistivity of outer portion 216 compared to inner portion 218. The top of first electrode 208 contacts the bottom of phase change material 210. In one embodiment, phase change material 210 has a greater cross-sectional width than first electrode 208.

Phase change material 210 may be made up of a variety of materials in accordance with the present invention. Generally, chalcogenide alloys that contain one or more elements from group VI of the periodic table are useful as such materials. In one embodiment, phase change material 210 of phase change memory cell 200 is made up of a chalcogenide compound material, such as GeSbTe, SbTe, GeTe, or AgInSbTe. In another embodiment, phase change material 210 is chalcogen free, such as GeSb, GaSb, InSb, or GeGaInSb. In other embodiments, phase change material 210 is made up of any suitable material including one or more of the elements Ge, Sb, Te, Ga, As, In, Se, and S.

The top of phase change material 210 contacts the bottom of second electrode 212. In one embodiment, second electrode 212 has the same cross-sectional width as phase change material 210. Second electrode 212 includes TiN, TaN, W, Al, Ti, Ta, TiSiN, TaSiN, TiAlN, TaAlN, WN, C, Cu, or other suitable electrode material. Dielectric material 204 laterally surrounds contact 202. Dielectric material 204 includes $SiO_2$, $SiO_x$, SiN, fluorinated silica glass (FSG), boro-phosphorus silicate glass (BPSG), boro-silicate glass (BSG), or other suitable dielectric material. Dielectric material 206 laterally surrounds the top portion of contact 202. Dielectric material 206 includes SiN or other suitable dielectric material. Dielectric material 214 laterally surrounds first electrode 208, phase change material 210, and top electrode 212. Dielectric material 214 includes $SiO_2$, $SiO_x$, SiN, FSG, BPSG, BSG, or other suitable dielectric material.

Phase change material 210 provides a storage location for storing one or more bits of data. During operation of memory cell 200, current or voltage pulses are applied between first electrode 208 and second electrode 212 to program the memory cell. The current or voltage pulses are confined to the inner portion 218 of first electrode 208 due to the lower resistivity of inner portion 218 compared to outer portion 216. Therefore, the active or phase change region in phase change material 210 is at or close to the interface area between inner portion 218 of first electrode 208 and phase change material 210.

During a set operation of memory cell 200, one or more set current or voltage pulses are selectively enabled by write circuit 102 and sent to first electrode 208 or second electrode 212. From first electrode 208 or second electrode 212, the set current or voltage pulses pass through phase change material 210 thereby heating the phase change material above its crystallization temperature (but usually below its melting temperature). In this way, the phase change material reaches a crystalline state or a partially crystalline and partially amorphous state during the set operation.

During a reset operation of memory cell 200, a reset current or voltage pulse is selectively enabled by write circuit 102 and sent to first electrode 208 or second electrode 212. From first electrode 208 or second electrode 212, the reset current or voltage pulse passes through phase change material 210. The reset current or voltage quickly heats the phase change material above its melting temperature. After the current or voltage pulse is turned off, the phase change material quickly quench cools into an amorphous state or a partially amorphous and partially crystalline state.

The following FIGS. 4-13 illustrate embodiments of a process for fabricating a phase change memory cell, such as phase change memory cell 200 previously described and illustrated with reference to FIG. 3.

Figure 4:
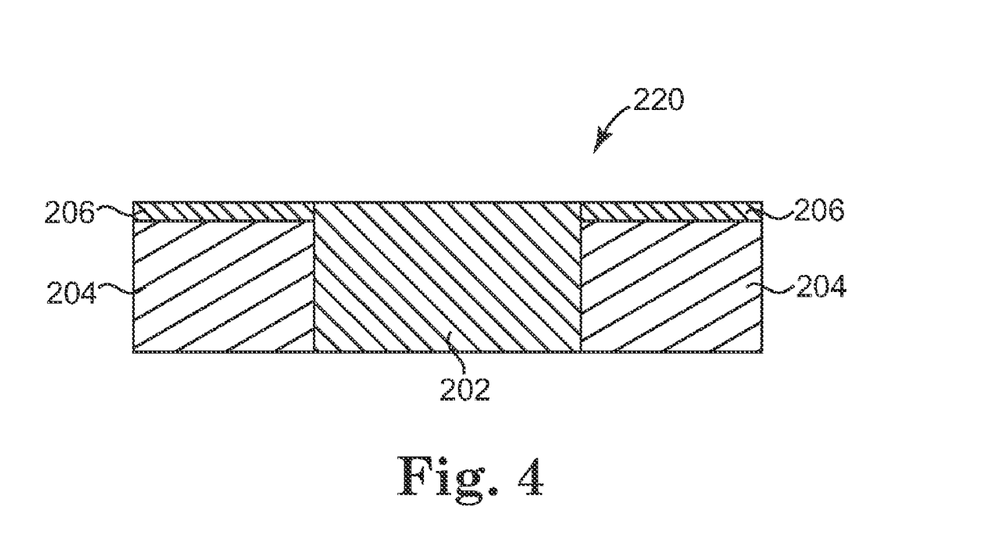
FIG. 4 illustrates a cross-sectional view of one embodiment of a preprocessed wafer.

FIG. 4 illustrates a cross-sectional view of one embodiment of a preprocessed wafer 220. Preprocessed wafer 220 includes dielectric material 204 and 206, a contact 202, and lower wafer layers (not shown). The top of dielectric material 204 contacts the bottom of dielectric material 206. Dielectric material 206 acts as an etch stop material layer in the subsequent fabrication process. Dielectric material 204 includes $SiO_2$, $SiO_x$, SiN, FSG, BPSG, BSG, or other suitable dielectric material. Dielectric material 206 includes SiN or other suitable dielectric material. Contact 202 includes W, Cu, Al, or other suitable contact material. Dielectric material 204 and 206 laterally surround contact 202 and isolate contact 202 from adjacent device features.

Figure 5:
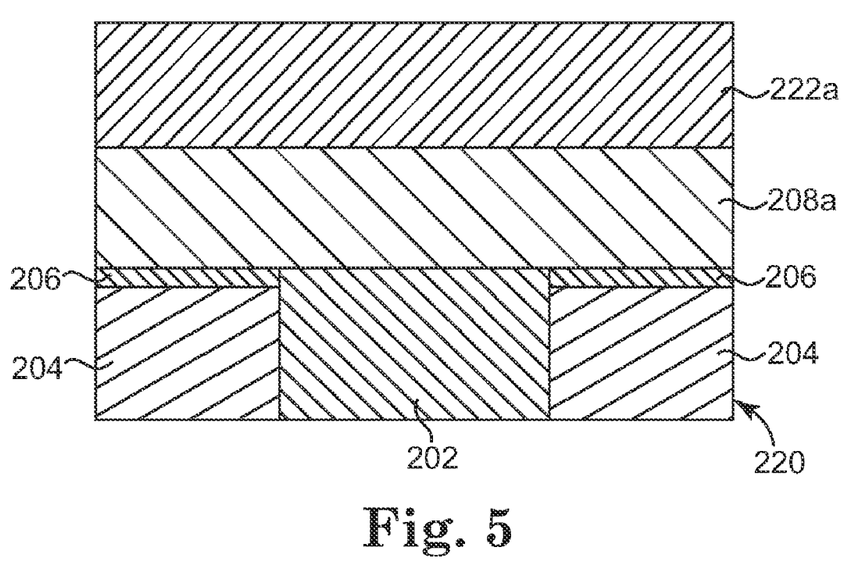
FIG. 5 illustrates a cross-sectional view of one embodiment of the preprocessed wafer, an electrode material layer, and a hardmask material layer.

FIG. 5 illustrates a cross-sectional view of one embodiment of preprocessed wafer 220, an electrode material layer 208a, and a hardmask material layer 222a. An electrode material, such as TiN, TaN, W, Al, Ti, Ta, TiSiN, TaSiN, TiAlN, TaAlN, WN, C, Cu, or other suitable electrode material is deposited over preprocessed wafer 220 to provide electrode material layer 208a. In one embodiment, electrode material layer 208a is deposited to a thickness of 100 nm or another suitable thickness. Electrode material layer 208a is deposited using chemical vapor deposition (CVD), high density plasma-chemical vapor deposition (HDP-CVD), atomic layer deposition (ALD), metal organic chemical vapor deposition (MOCVD), plasma vapor deposition (PVD), jet vapor deposition (JVD), or other suitable deposition technique.

A hardmask material, such as SiN or other suitable hardmask material is deposited over electrode material layer 208a to provide hardmask material layer 222a. In one embodiment, more than one hardmask material layer is deposited to provide hardmask material layer 222a, such as a layer of SiN and a layer of $SiO_2$. Hardmask material layer 222a is deposited using CVD, HDP-CVD, ALD, MOCVD, PVD, JVD, spin on, or other suitable deposition technique.

Figure 6:
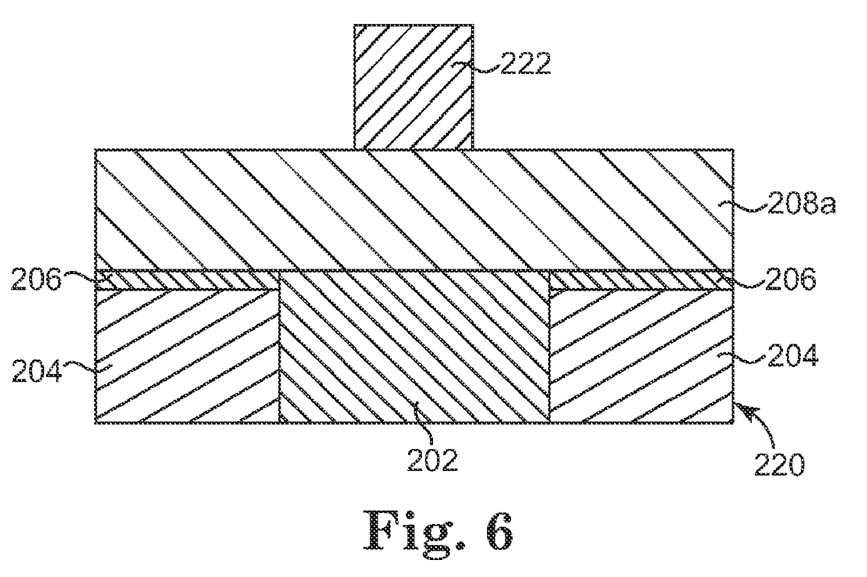
FIG. 6 illustrates a cross-sectional view of one embodiment of the preprocessed wafer, the electrode material layer, and a hardmask after etching the hardmask material layer.

FIG. 6 illustrates a cross-sectional view of one embodiment of preprocessed wafer 220, electrode material layer 208a, and a hardmask 222 after etching hardmask material layer 222a. Hardmask material layer 222a is etched to expose portions of electrode material layer 208a to provide hardmask 222. In one embodiment, hardmask 222 is trimmed using a suitable trimming process to reduce the cross-sectional width of hardmask 222 to a sublithographic cross-sectional width. In one embodiment, hardmask 222 is centered over contact 202.

Figure 7A:
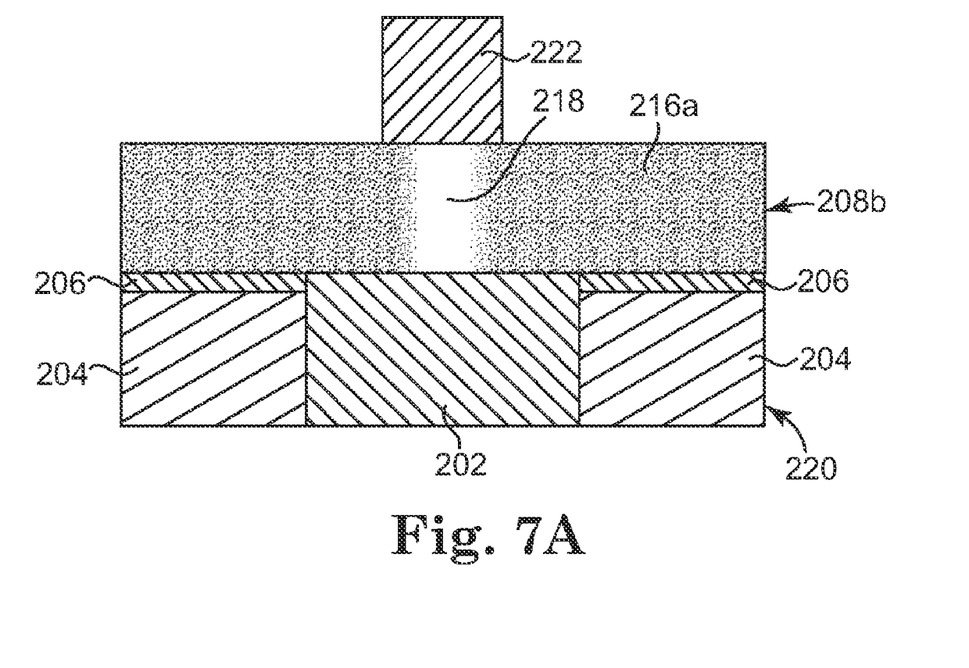
FIG. 7A illustrates a cross-sectional view of one embodiment of the preprocessed wafer, the electrode material layer, and the hardmask after implanting the electrode material layer.

FIG. 7A illustrates a cross-sectional view of one embodiment of preprocessed wafer 220, electrode material layer 208b, and hardmask 222 after implanting electrode material layer 208a. In this embodiment, electrode material layer 208a is implanted with a dopant to provide electrode material layer 208b including an implanted portion 216a and a non-implanted portion 218. In one embodiment, an angled implant is used that can reach under the edge of hardmask 222. The angled implant does not reach portion 218. In one embodiment, electrode material layer 208a is implanted with N, Si, Al, C, Ar, or other suitable dopant. Electrode material layer 208a is implanted using ion beam implantation, plasma immersion ion implantation, or other suitable implantation technique. The implanted portion 216a has a greater resistivity than non-implanted portion 218.

Figure 7B:
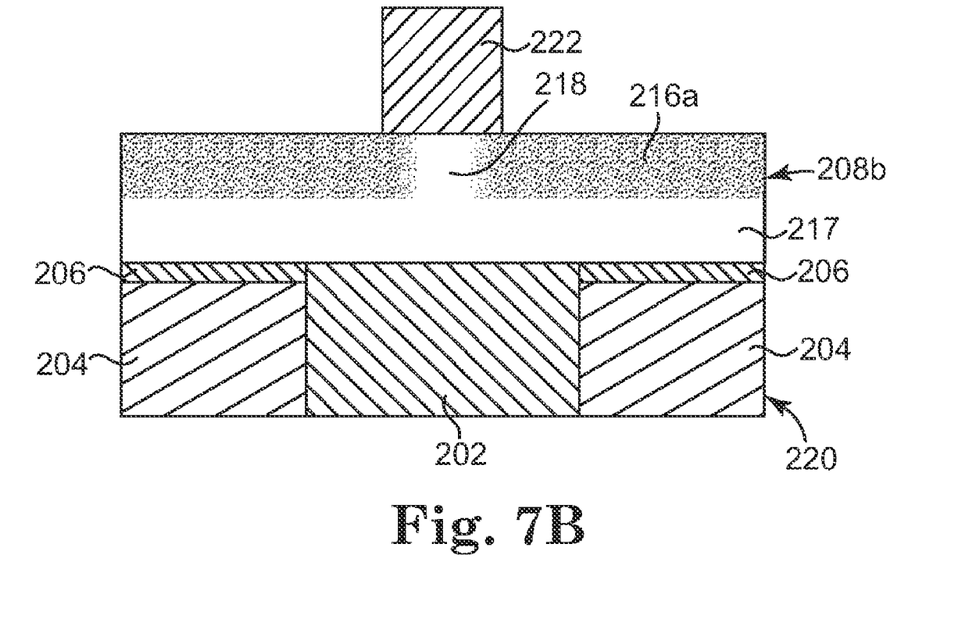
FIG. 7B illustrates a cross-sectional view of another embodiment of the preprocessed wafer, the electrode material layer, and the hardmask after implanting the electrode material layer.

FIG. 7B illustrates a cross-sectional view of another embodiment of preprocessed wafer 220, electrode material layer 208b, and hardmask 222 after implanting electrode material layer 208a. In this embodiment, only a top portion of electrode material layer 208a is implanted with a dopant to provide electrode material layer 208b including an implanted portion 216a and non-implanted portions 217 and 218.

Figure 8:
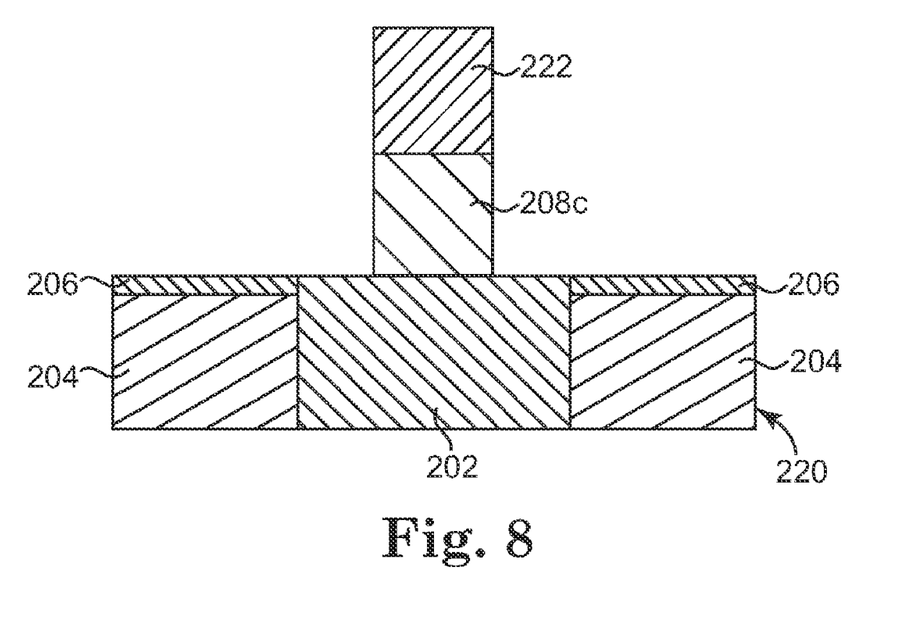
FIG. 8 illustrates a cross-sectional view of one embodiment of the preprocessed wafer, a first electrode, and the hardmask after etching the electrode material layer.

FIG. 8 illustrates a cross-sectional view of one embodiment of preprocessed wafer 220, a first electrode 208c, and hardmask 222 after etching electrode material layer 208a. In this embodiment, the ion implantation as described above with reference to FIG. 7A is not yet performed. In this embodiment, the exposed portions of electrode material layer 208a are etched to expose portions of contact 202 and dielectric material layer 206 to provide first electrode 208c. In one embodiment, first electrode 208c is cylindrical in shape and centered over contact 202.

Figure 9:
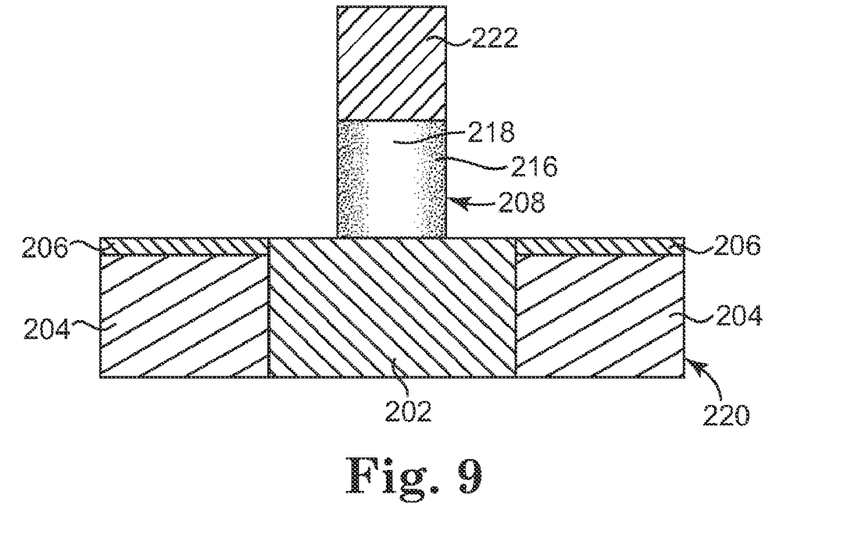
FIG. 9 illustrates a cross-sectional view of one embodiment of the preprocessed wafer, the first electrode, and the hardmask after implanting the first electrode or after etching the implanted electrode material layer.

FIG. 9 illustrates a cross-sectional view of one embodiment of preprocessed wafer 220, first electrode 208, and hardmask 222 after implanting first electrode 208c or after etching implanted electrode material layer 208b. In one embodiment, the exposed portions of electrode material layer 208b as previously described and illustrated with reference to FIG. 7A are etched to expose portions of contact 202 and dielectric material 206 to provide first electrode 208.

In another embodiment, first electrode 208c as previously described and illustrated with reference to FIG. 8 is implanted with a dopant to provide first electrode 208. First electrode 208 includes an implanted outer or sidewall portion 216 and a non-implanted inner or core portion 218. In one embodiment, an angled implant is used that can reach under the edge of hardmask 222. The angled implant does not reach portion 218. In one embodiment, first electrode 208c is implanted with N, Si, Al, C, Ar, or other suitable dopant. First electrode 208c is implanted using ion beam implantation, plasma immersion ion implantation, or other suitable implantation technique. The implanted portion 216 has a greater resistivity than non-implanted portion 218. As illustrated by FIGS. 7-9, the ion implantation can be performed before or after etching the electrode material layer to fabricate first electrode 208.

Figure 10:
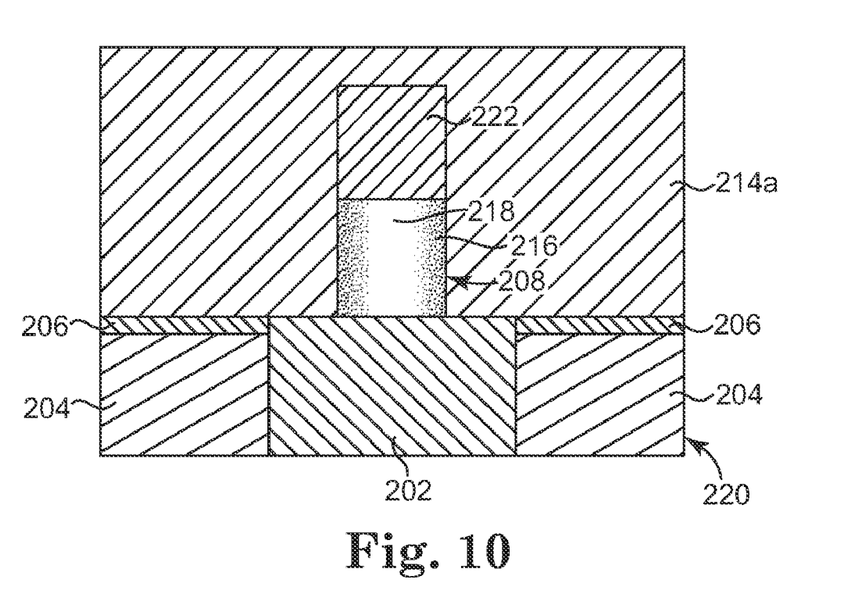
FIG. 10 illustrates a cross-sectional view of one embodiment of the preprocessed wafer, the first electrode, the hardmask, and a dielectric material layer.

FIG. 10 illustrates a cross-sectional view of one embodiment of preprocessed wafer 220, first electrode 208, hardmask 222, and a dielectric material layer 214a. A dielectric material, such as $SiO_2$, $SiO_x$, SiN, FSG, BPSG, BSG, or other suitable dielectric material is deposited over exposed portions of preprocessed wafer 220, first electrode 208, and hardmask 222 to provide dielectric material layer 214a. Dielectric material layer 214a is deposited using CVD, HDP-CVD, ALD, MOCVD, PVD, JVD, or other suitable deposition technique.

Figure 11:
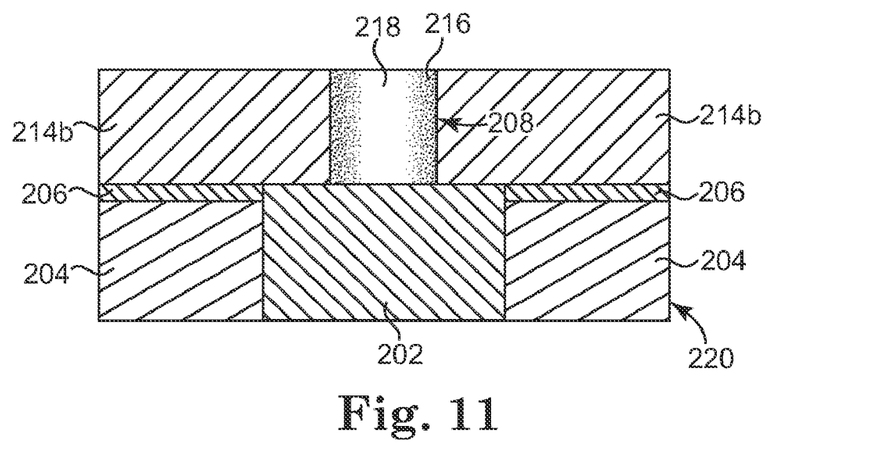
FIG. 11 illustrates a cross-sectional view of one embodiment of the preprocessed wafer, the first electrode, and the dielectric material layer after planarization.

FIG. 11 illustrates a cross-sectional view of one embodiment of preprocessed wafer 220, first electrode 208, and dielectric material layer 214b after planarization. Dielectric material layer 214a is planarized to remove hardmask 222 and to expose first electrode 208 to provide dielectric material layer 214b. Dielectric material layer 214a is planarized using chemical mechanical planarization (CMP) or other suitable planarization technique.

Figure 12:
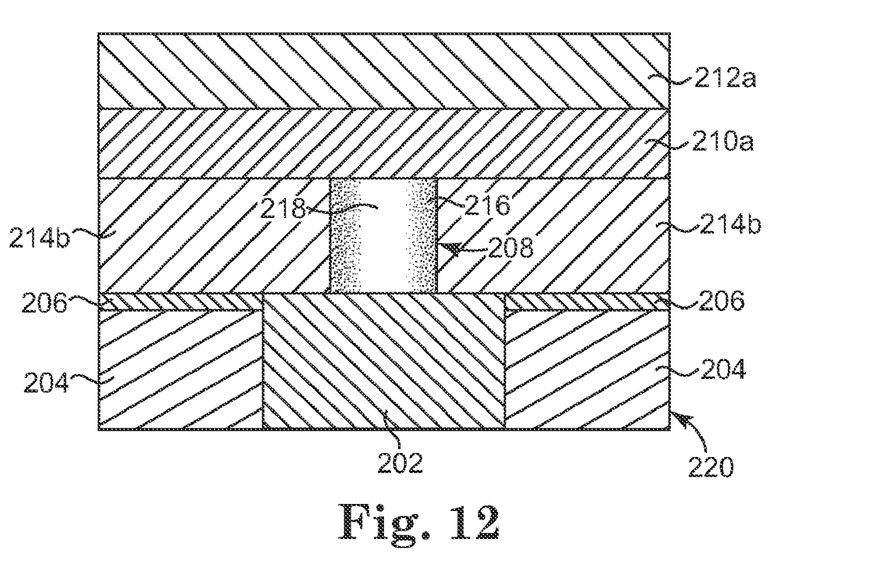
FIG. 12 illustrates a cross-sectional view of one embodiment of the preprocessed wafer, the first electrode, a phase change material layer, and an electrode material layer.

FIG. 12 illustrates a cross-sectional view of one embodiment of preprocessed wafer 220, first electrode 208, a phase change material layer 210a, and an electrode material layer 212a. A phase change material, such as a chalcogenide compound material or other suitable phase change material is deposited over exposed portions of dielectric material layer 214b and first electrode 208 to provide phase change material layer 210a. Phase change material layer 210a is deposited using CVD, HDP-CVD, ALD, MOCVD, PVD, JVD, or other suitable deposition technique.

An electrode material, such as TiN, TaN, W, Al, Ti, Ta, TiSiN, TaSiN, TiAlN, TaAlN, WN, C, Cu, or other suitable electrode material is deposited over phase change material layer 210a to provide electrode material layer 212a. Electrode material layer 212a is deposited using CVD, HDP-CVD, ALD, MOCVD, PVD, JVD, or other suitable deposition technique.

Figure 13:
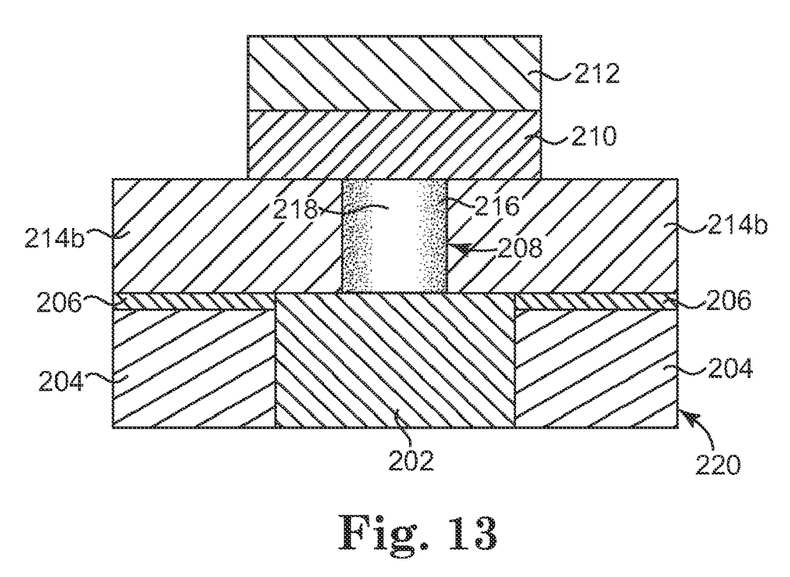
FIG. 13 illustrates a cross-sectional view of one embodiment of the preprocessed wafer, the first electrode, phase change material, and a second electrode.

FIG. 13 illustrates a cross-sectional view of one embodiment of preprocessed wafer 220, first electrode 208, phase change material 210, and a second electrode 212. Electrode material layer 212a and phase change material layer 210a are etched to expose portions of dielectric material layer 214b to provide phase change material 210 and second electrode 212. Phase change material 210 provides a storage location for one or more bits of data.

A dielectric material, such as $SiO_2$, $SiO_x$, SiN, FSG, BPSG, BSG, or other suitable dielectric material is deposited over exposed portions of second electrode 212, phase change material 210, and dielectric material layer 214b to provide a dielectric material layer. The dielectric material layer is deposited using CVD, HDP-CVD, ALD, MOCVD, PVD, JVD, or other suitable deposition technique. The dielectric material layer is then planarized using CMP or another suitable planarization technique to provide phase change memory cell 200 as previously described and illustrated with reference to FIG. 3.

Embodiments provide a phase change memory cell including an electrode having a radial variation in resistivity for constricting current flow through the electrode. The variation in resistivity increases the current density through the center of the electrode, thereby reducing the current used to program the memory cell. In addition, the increased resistivity of a portion of the electrode increases the thermal insulation of the active region of the phase change material, thereby further reducing the current used to program the memory cell.

While the specific embodiments described herein substantially focused on fabricating phase change memory cells, the embodiments can be applied to any suitable type of resistive or resistivity changing memory cells.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. An integrated circuit comprising:
a first electrode including an upper portion and a lower portion, the upper portion including an inner portion and an outer portion laterally surrounding the inner portion, the outer portion having a greater resistivity than the inner portion, the lower portion having the same resistivity as the inner portion and the same cross-sectional width as the upper portion;
a second electrode; and
resistivity changing material contacting the first electrode and coupled to the second electrode.

2. The integrated circuit of claim 1, wherein the outer portion of the first electrode is implanted with a dopant.

3. The integrated circuit of claim 2, wherein the dopant comprises one of N, Si, Al, C, and Ar.

4. The integrated circuit of claim 1, wherein the first electrode comprises one of TiN, TaN, W, Al, Ti, Ta, TiSiN, TaSiN, TiAlN, TaAlN, WN, C, and Cu.

5. The integrated circuit of claim 1, wherein the resistivity changing material comprises phase change material.

6. A system comprising:
a host; and
a memory device communicatively coupled to the host, the memory device comprising:
a first electrode including an upper portion and a lower portion, the upper portion including a core portion and a sidewall portion laterally surrounding the core portion, the sidewall portion having a greater resistivity than the core portion, the lower portion having the same resistivity as the core portion and the same cross-sectional width as the upper portion;
a second electrode; and
resistivity changing material contacting the first electrode and coupled to the second electrode.

7. The system of claim 6, wherein the sidewall portion of the first electrode is implanted with a dopant.

8. The system of claim 6, wherein a cross-sectional width of the resistivity changing material is greater than a cross-sectional width of the first electrode.

9. The system of claim 6, wherein the resistivity changing material comprises phase change material.

10. The system of claim 6, wherein the memory device further comprises:
a write circuit configured to write a resistance state to the resistivity changing material;
a sense circuit configured to read a resistance state of the resistivity changing material; and
a controller configured to control the write circuit and the sense circuit.

11. A method for fabricating an integrated circuit, the method comprising:
providing a preprocessed wafer including a contact;
fabricating a first electrode coupled to the contact, the first electrode including an inner portion and an outer portion laterally surrounding the inner portion, the outer portion having a greater resistivity than the inner portion;
fabricating a resistivity changing material storage location contacting the first electrode; and
fabricating a second electrode coupled to the resistivity changing material,
wherein fabricating the first electrode comprises:
depositing an electrode material over the preprocessed wafer;
etching the electrode material to provide the first electrode including the inner portion and the outer portion; and
implanting the outer portion of the first electrode with a dopant to increase the resistivity of the outer portion after depositing and etching the electrode material.

12. The method of claim 11, wherein fabricating the resistivity changing material storage location comprises fabricating a resistivity changing material storage location having a greater cross-sectional width than a cross-sectional width of the first electrode.

13. The method of claim 11, wherein fabricating the resistivity changing material storage location comprises fabricating a phase change material storage location.

14. The method of claim 11, wherein implanting the outer portion of the first electrode comprises ion beam implanting the outer portion of the first electrode.

15. A method for fabricating a memory, the method comprising:

providing a preprocessed wafer including a contact;

fabricating a first electrode coupled to the contact, the first electrode including a core portion and a sidewall portion laterally surrounding the core portion, wherein fabricating the first electrode comprises depositing an electrode material for the core portion and the sidewall portion and implanting the sidewall portion with a dopant after depositing the electrode material for the core portion and the sidewall portion such that the sidewall portion has a greater resistivity than the core portion;

fabricating a phase change material storage location contacting the first electrode; and fabricating a second electrode coupled to the phase change material storage location.

16. The method of claim 15, wherein fabricating the first electrode comprises:

depositing the electrode material over the preprocessed wafer;

etching the electrode material to provide the first electrode; and implanting the sidewall portion of the first electrode with the dopant after etching the electrode material.

17. The method of claim 15, wherein fabricating the first electrode comprises:

depositing the electrode material over the preprocessed wafer;

fabricating a mask over the electrode material to mask a portion of the electrode material;

implanting exposed portions of the electrode material and an outer portion of the masked electrode material with the dopant; and etching exposed portions of the electrode material to provide the first electrode.

18. The method of claim 15, wherein implanting the electrode material comprises ion beam implanting the electrode material.

19. The method of claim 15, wherein implanting the electrode material comprises plasma immersion ion implanting the electrode material.

20. A method for fabricating a memory, the method comprising:

providing a preprocessed wafer including a contact;

fabricating a first electrode coupled to the contact, the first electrode including an inner portion and an outer portion laterally surrounding the inner portion, the outer portion having a greater resistivity than the inner portion;

fabricating a resistivity changing material storage location contacting the first electrode; and fabricating a second electrode coupled to the resistivity changing material, wherein fabricating the first electrode comprises:

depositing an electrode material over the preprocessed wafer for the inner portion and the outer portion;

fabricating a mask over the electrode material to mask a portion of the electrode material;

implanting the electrode material with a dopant to increase the resistivity of exposed portions of the electrode material and an outer portion of the masked electrode material after depositing the electrode material and fabricating the mask; and etching exposed portions of the electrode material to provide the first electrode.

21. The method of claim 20, wherein fabricating the resistivity changing material storage location comprises fabricating a resistivity changing material storage location having a greater cross-sectional width than a cross-sectional width of the first electrode.

22. The method of claim 20, wherein fabricating the resistivity changing material storage location comprises fabricating a phase change material storage location.

23. The method of claim 20, wherein implanting the electrode material comprises ion beam implanting the electrode material.

\* \* \* \* \*